United States Patent
Su et al.

(10) Patent No.: US 11,803,685 B1
(45) Date of Patent: Oct. 31, 2023

(54) LAYOUT DESIGN METHOD, CHIP AND TERMINAL OF POWER DEVICE

(71) Applicant: Chengdu Fujin Power Semiconductor Technology Development Co., Ltd, Sichuan (CN)

(72) Inventors: Chun Su, Sichuan (CN); Shuai Zhang, Sichuan (CN); Yu Liu, Sichuan (CN); Hongshuang Dong, Sichuan (CN); Wei Chen, Sichuan (CN); Yi Chen, Sichuan (CN); Xin Wang, Sichuan (CN); Gaoqiang Dai, Sichuan (CN)

(*) Notice: Subject to any disclaimer, the term of this patent is extended or adjusted under 35 U.S.C. 154(b) by 0 days.

(21) Appl. No.: 18/152,268

(22) Filed: Jan. 10, 2023

(30) Foreign Application Priority Data

Jun. 13, 2022 (CN) .......................... 202210659324.0

(51) Int. Cl.
 *G06F 30/392* (2020.01)
(52) U.S. Cl.
 CPC .................................. *G06F 30/392* (2020.01)
(58) Field of Classification Search
 CPC ...... G06F 30/39; G06F 30/392; G06F 30/394; G06F 30/398
 USPC ........................................... 916/119; 716/119
 See application file for complete search history.

(56) References Cited

U.S. PATENT DOCUMENTS

| | | | |
|---|---|---|---|
| 2016/0372414 A1 | 12/2016 | Song et al. | |
| 2021/0174001 A1 | 6/2021 | Kim et al. | |
| 2023/0077532 A1* | 3/2023 | Kim | G06F 30/392 |
| | | | 716/119 |

FOREIGN PATENT DOCUMENTS

| | | |
|---|---|---|
| CN | 102315110 A | 1/2012 |
| CN | 102855360 A | 1/2013 |
| CN | 103730460 A | 4/2014 |
| CN | 103730493 A | 4/2014 |

(Continued)

OTHER PUBLICATIONS

Li Fang, Jiao Jiye, Ma Caicai. H-bridge driver circuit layout design based on HVCMOS technology[J]. Application of Electronic Technique, 2021, 47(6) : 35-39.

(Continued)

*Primary Examiner* — Paul Dinh

(57) ABSTRACT

The disclosure discloses a layout design method, chip and terminal of power device, wherein the non-top metal layout design: the metal is routed along the first direction and several metal wires that fully occupy the available area of the die unit are thereby obtained, and the wiring properties of the metal wires are sequentially changed at intervals, making the source ends and the drain ends of the device are alternately distributed at intervals, and the metal routing in two or more layers of non-top metal are arranged vertically; the top metal layout design: the source end region and drain end region in the top metal are formed into sheets independently and the pad is arranged in the top metal region; eventually realize the interconnection of metal layers and complete the layout design. The disclosure adopts a criss-cross design between non-top metals, thereby the device has a smaller parasitic resistance value; the removal of the stack-up design can reduce the metal layer design and save the cost; the source end and drain end regions in the top metal are designed into sheets to ensure the adequacy of the interconnection between the metal layers and further improve the reliability of the device.

10 Claims, 5 Drawing Sheets

(56) References Cited

FOREIGN PATENT DOCUMENTS

| CN | 110895648 A | 3/2020 |
|---|---|---|
| CN | 112541320 A | 3/2021 |
| CN | 114548019 A | 5/2022 |
| WO | 2021227372 A1 | 11/2021 |

OTHER PUBLICATIONS

Sowade E, Polomoshnov M, Willert A, et al. Toward 3D-Printed Electronics: Inkjet-Printed Vertical Metal Wire Interconnects and Screen-Printed Batteries[J]. Advanced Engineering Materials, 2019.

* cited by examiner

LAYOUT DESIGN METHOD, CHIP AND TERMINAL OF POWER DEVICE

TECHNICAL FIELD

The disclosure relates to the technical field of integrated circuit manufacturing of Si-based semiconductors, in particular to a layout design method, chip and terminal of power device.

BACKGROUND

Power devices are mainly used in high-voltage and high-current circuit scenarios, such as power modules. The power device adopts large gate width parallel design and large-area metal wiring design to meet its application demands of high current and high voltage. However, limited by the consideration of product area and process cost, the power device product design generally aims to achieve larger gate width under a fixed area, pursues fewer metal layers and reduces the manufacturing cost of power device products, thereby improving the market competitiveness of products.

High-voltage and large-current application scenarios of power devices require power device products to have good reliability and area utilization as large as possible. Therefore, in the layout design of power devices, it is necessary to maintain a high degree of consistency with the process design rules (adopting large wire width routing and minimum metal wire spacing as far as possible) for the purpose of optimizing the overall metal arrangement strategy and comprehensively considering the layout drawing techniques at the same time, thereby efficiently outputting the power device layout design of high reliability.

The existing metal arrangement scheme of power device generally increases the metal overcurrent capability by stack-up wiring of two layers of metal, that is, at least two layers of adjacent metal (non-top metal) need to be wired in the same direction, and the top metal runs through the metal design as the other direction, and in combination with the metal connections between the source and drain ends of the device, at least 4 layers of metal need to be applied to realize the device layout design, significantly increasing the process costs; on the other hand, the parasitic resistance cannot be reduced effectively by the stack-up wiring design, and the performance of power devices still needs to be further improved.

SUMMARY

The objectives of the disclosure are to overcome the shortcomings of the prior art and provide a layout design method, chip and terminal of power device.

The purpose of the disclosure is realized by the following technical solution: a layout design method of power device, which specifically comprises the design steps of non-top metal layout, design steps of top metal layout and design steps of metal layer interconnection as follow:

Non-top metal layout design: the first metal is routed along the first direction and several first metal wires that fully occupy the available area of the die unit are thereby obtained, and the wiring properties of the first metal wires are sequentially changed at intervals, making the first source ends and the first drain ends of the device are alternately distributed at intervals to complete the layout design of the first layer of metal;

The second metal is routed along the vertical direction of the first direction and several second metal wires that fully occupy the available area of the die unit are thereby obtained, and the wiring properties of the second metal wires are sequentially changed at intervals, making the second source ends and the second drain ends of the device are alternately distributed at intervals to complete the layout design of the second layer of metal;

Top metal layout design: the source end region and drain end region in the top metal are formed into sheets independently and the pad is arranged in the top metal region;

Metal layer interconnection design: the overlapping regions of the first and the second metal wires with the same wiring properties are connected through the first contact hole, and the first or the second metal wire with the same wiring properties as the top metal is connected through the second contact hole. In the interconnection design of top metal, the source end region is directly interconnected with the second source end or the first source end, the drain end region is directly interconnected with the second drain end or the first drain end, and the top metal is directly interconnected with the first metal wire (the first source end or the first drain end) or directly interconnected with the second metal wire (the second source end or the second drain end) depends on whether the first metal layer is used as the underlying metal or the second metal layer is used as the underlying metal in the present layout design process.

Specifically, the first direction in the layout design steps of non-top metal can be direction x or direction y, or the like, preferably the die direction. Non-top metals and top metals are metals with strong conductivity, such as gold and copper. In this step, the first metal is routed through along the die direction (direction y) and is routed repeatedly at certain intervals until the available area of the die unit is covered. The wiring properties are source ends (source electrodes) or drain ends (drain electrodes) of devices. The entire layout design in this example comprises N die units, where N is a positive integer, and when N≥2, the layout design based on the available area of the die units may be used in a specific absolute symmetric layout design scenario, thereby improving the design efficiency. The available area of the die unit represents the upper limit of the area of power device in the layout wiring design. More specifically, if the routing of the second metal runs through and perpendicular to the die direction, then the planning and design are performed from the upper metal layer to the lower metal layer in turn and perpendicularly, without stack-up wiring, and the metals directly facing the upper and lower layers with the same potential are connected through sufficient via holes, which is equivalent to parallel connection, that is, in this example, the criss-cross design between non-top metals can form the highest number of parallel structures, and that metals of the upper and lower adjacent layer are strongly connected in a cross-grid manner, thereby realizing smaller parasitic resistance value.

As an option, the number of layers of non-top metal is greater than or equal to 2, and the metal of layer i is perpendicular to the metal of layer (i−1) (i≥2), and when i is greater than 2, each non-top metal is adjacently interconnected from bottom to top; it is preferable that i=2, thereby making the minimal metal layer of the device be 3 layers, reducing one layer of metal design and further saving the cost of tape out.

Specifically, in the layout design steps of the top metal, the top metal is divided into a source end region and a drain end region to realize the design of sheets of the source end region and drain end region. Compared with the layout design method in which the pad is arranged outside the top metal in the prior art, the disclosure adopts a large sheet metal design, which can ensure the sufficiency of the interconnection between metal layers, enable a larger contact area and reduce parasitic resistance; meanwhile, the pad is directly arranged in the top metal region, which can further converge the device area and improve the integration of the device. Further, the layout design planning of top metal includes the pad area planning of the top layer, that is, the pad is arranged right above the overall MOS (Field Effect Transistor) placement region; the layout design of top metal also includes the remaining area planning of the Pad region and the remaining contacts of the power device, such as gate contacts. The top metal is designed into sheets in this example, which is naturally consistent with the demand that a large pad requires covering by large top metal, and can be applied to the design demands of unconventional (greater than 300 μm*300 μm) large pad.

In the interconnection design process of metal layers of the present application, the interconnection of underlying metal, sub-top metal and top metal is realized sequentially, that is, the trenching design of wide metal is completed, and contact holes between metal layers are fully filled, thereby realizing the strong connection of cross-grid of adjacent layers of metals. Both the first layer and the second layer of metal in this example can be used as the underlying metal or sub-top metal, therefore there are two interconnection modes in the interconnection design process. Preferably, the first layer of metal is the underlying metal and the second layer of metal is the sub-top metal. At this time, the overlapping regions with the same wiring properties in the underlying metal and sub-top metal are connected through the first contact hole, and the overlapping regions with the same wiring properties in the sub-top metal and top metal are connected through the second contact hole, thereby realizing the sufficient connection between the metal layers.

The preferred design scheme for reducing the parasitic resistance in this example can promote a higher quality of the overall project efficiency, and since this design method directly applies the scheme for optimizing the metal parasitic resistance to the layout design, the modification in the later physical verification and parameter extraction steps can be almost omitted.

In an example, the first metal is routed along the first direction at the first wire width and the first interval and several first metal wires evenly distributed are thereby obtained; and/or, the second metal is routed along the second direction at the second wire width and the second interval and several second metal wires evenly distributed are thereby obtained. Under the condition of meeting the overcurrent capability, the spacing between metal wires should be reduced as much as possible, thereby realizing the arrangement with more metal wires to ensure the device performance; meanwhile, the non-top metal is routed in an equal-width manner, which facilitates the control of overcurrent capability of metal wires, and on the other hand, more parallel structures can be formed by the strong connection of uniform cross-grid of adjacent layers of metals, minimizing the parasitic resistance of the device.

In an example, the adjustment of the wire width of the last metal wire before occupying the available area of the die unit according to the remaining available area of the die unit can improve the overcurrent capability of the metal wire, enhancing the reliability of the device.

In an example, the first wire width and the second wire width are adjusted according to the current flowing through the present metal wire. The metal wire width can be given by the engineer according to the layout design planning of each metal layer or can be obtained based on historical data or calculated according to the design requirements of the current layout.

In an example, the method further comprises the evaluation steps of:
  Evaluation of the overcurrent capability of a single metal wire in non-top metal; and/or,
  Evaluation of the quantity allocation of source ends and the drain ends in non-top metal; and/or,
  Evaluation of the quantity allocation of source ends and the drain ends in top metal, and/or the pad placement region;
  Where the evaluation result is unqualified, the layout design should be modified; otherwise, the final layout design will be thereby obtained.

Specifically, the overcurrent capability evaluation is to judge whether the present metal wire width meets the process current requirement of the present layout design, if not, a non-conformance prompt is outputted and the metal wire width needs to be further adjusted. For example, the metal wire width is directly adjusted according to the last wire width planning of each layer of metal wires to reduce or increase the last metal wire width and then adjust the overall metal wiring distribution, thereby optimizing the layout design to obtain the expected results. Evaluate the quantity allocation of the source end and drain end and the pad placement region, that is, the rationality evaluation of the planned starting-ending allocation of metal of the source end and drain end, and specifically determine whether a source end/drain end quantity allocation scheme and an allocation scheme for metal near the pad need to be optimized according to different circuit connection modes, with symmetry, robustness and smoothness as the evaluation criteria. In case of non-conformance, then further adjust the quantity allocation of the source end and drain end or the pad placement region.

Preferably, the above evaluation steps are set before the design steps of metal layer interconnection, thereby avoiding the generation of through-holes (contact holes) and the reduction of layout design efficiency and accuracy during the repeated adjustment design process.

In an example, the method further comprises the frontend layout design:
  The frontend layout is generated according to chip area parameters, power device schematic diagram and process parameters. The frontend layout refers to the process below the through-hole (included) of the doping region under a specific process, including the layout layers such as the doping region, injection region, well region, and gate region. The chip area parameter is specifically the area parameter of the chip in this project or the area parameter allowed by the power chip layout drawing, which can be calculated and obtained by automatically capturing the peripheral layout graphic design under that process through data processing software such as Cadence, ADS, Aether and L-edit. The graphic design of the peripheral layout comprises the physical layer design parameter and number of coils of the guard ring, thereby automatically realizing the accurate design and occupation of boundary graphics within the area and the visual output of the layout of the actual available design area. Power device schematic diagram reflects the arrangement mode and process category information of power devices, and the unique frontend layout can be obtained by combining chip area parameters, power device schematic diagram and process parameters. Process parameters are the key parameters for generating frontend layout design, including the spacing between the boundary of the die diffusion region and the boundary of the innermost guard ring diffusion region (including direction X and direction Y), and the specific parameter values such as die pitch. Since the process parameters are environmental setting parameters, which have been set before applying the method of this example, the frontend layout produced is naturally consistent with process parameters, and there is almost no need to modify it in the later physical verification stage of layout design.

In an example, the generated frontend layout design specifically includes:

Calculation of the number of cells that can be placed and the width between cells according to the chip area parameters, power device schematic diagram and process parameters, thereby outputting the layout design drawing of the frontend physical layer under a holistic vision.

In an example, the frontend layout is divided multiple times, that is, divided twice or more, and multiple die units are thereby obtained. Specifically, the calculation formula of the source/drain channel resistance $R_{on}$ is:

$$R_{on} = \frac{1}{\mu_n C_{ox} \frac{W}{L}(V_{GS} - V_{TH})}$$

wherein: $\mu_n$ represents electron mobility; $C_{ox}$ represents capacitance per unit area; $V_{GS}$ represents gate-source voltage; $V_{TH}$ represents device threshold voltage. Under a fixed voltage and current application scenario, the variables that can be changed are the device gate length L and the total gate width W. For those skilled in the art, it can be seen from the above formula, when other variables are fixed, the larger the total gate width W, the smaller the trench resistance value of the device. Under the guidance of this calculation formula, the layout design engineer will, under certain area constraints, achieve the larger the total gate width, the better. However, in practical application, when the total gate width is greater than a certain threshold, a larger metal parasitic resistance will be generated. Therefore, the disclosure aims to determine the balanced relationship between the total gate width and the source/drain channel resistance $R_{on}$, thereby obtaining a globally better parasitic resistance value. Preferably, the frontend layout is divided 3-5 times, which is beneficial to further reduce the parasitic effect of the metal.

It should be further noted that the technical features corresponding to the above-mentioned examples may be combined or replaced with each other to form a new technical solution.

The disclosure further comprises a chip, which is prepared and obtained using the layout design method of power device formed by any one or a combination of multiple examples above.

The disclosure further comprises a storage medium on which computer instructions are stored, and the steps of the layout design method of power device formed by any one or multiple examples above are performed when the computer instructions are executed, and the devices or structures involved in the method execution process at this moment are analog devices or structures, thereby generating the corresponding layout design drawings.

The disclosure further comprises a terminal including a memory and a processor, wherein computer instructions that can be operated in the processor are stored in the memory, and the steps of the layout design method of power device formed by any one or multiple examples above are performed when the computer instructions are executed by the processor, and the devices or structures involved in the method execution process at this moment are analog devices or structures, thereby generating the corresponding layout design drawings.

Compared with the prior art, the disclosure has the following beneficial effects:

1. In an example, a criss-cross design is adopted between non-top metals, and more parallel structures can be formed, thereby the device has a smaller parasitic resistance value to improve the power device performance; at the same time, the removal of the stack-up design can make the minimal metal layer of the device be 3 layers, reducing one layer of metal design and further saving the cost of tape out; further, the source end and drain end regions in the top metal are designed into sheets to ensure the adequacy of the interconnection between the metal layers, which can enable a larger contact area and reduce parasitic resistance, further improving the device reliability; in addition, the pad is directly arranged in the top metal region, which can further converge the device area and improve the integration of the device.

2. In an example, the uniform distribution of metal wires enables more parallel structures to be obtained, thereby minimizing the parasitic resistance of the device.

3. In an example, the last metal wire is adjusted according to the remaining available area, which can improve the overcurrent capability of the metal wire, enhancing the reliability of the device.

4. In an example, the reliability of the layout design can be ensured through the evaluation steps to avoid the problem that the unevaluated layout design is directly used for the mass production of devices to cause the non-conforming performance of the produced devices and further cause waste of time, material resources and financial resources.

5. In an example, the whole process design of power device layout is realized in combination with the frontend layout design method and the metal layer layout design method, which can improve the design efficiency of layout design engineers who still lack experience, and enable layout design engineers with any experience level to effectively output high-quality layout within a limited time.

BRIEF DESCRIPTION OF DRAWINGS

The specific embodiments of the disclosure will be further detailed in combination with the drawings. The drawings illustrated herein are used to provide a further understanding of the present application and constitute a part of the present application. In the drawings, the same reference numeral is used to indicate the same or similar parts. The exemplary embodiments of the present application and descriptions thereof are not intended to limit the present application, but only to explain the present application.

In which: 1—injection region; 2—active region; 3—gate region; 4—through-hole region; 5—well region; 6—first source end; 7—first drain end; 8—second source end; 9—second drain end; 10—source end region; 11—drain end region; 12—pad.

DETAILED DESCRIPTION OF PREFERRED EMBODIMENT

The technical solutions of the disclosure will be clearly and completely described in conjunction with the drawings. Apparently, the embodiments described below are part, not all, of the embodiments of the disclosure. Based on the embodiments described herein, all other embodiments obtained by those of ordinary skill in the art without creative work are within the scope of the disclosure.

It needs to be noted that the directions or position relationships such as "central", "upper", "lower", "left", "right", "vertical", "horizontal", "inside", and "outside" in the description of the disclosure are based on those on drawings, and are used only for facilitating the description of the disclosure and for simplified description, not for indicating or implying that the target devices or components must have a special direction and be structured and operated at the special direction, therefore, they cannot be understood as the restrictions to the disclosure. Moreover, the ordinal numeral such as "first and second" and "first to the fourth" are used only for distinguishing objects, and are not limited to this sequence. They cannot be understood as an indication or implication of relative importance.

It needs to be noted in the description of the disclosure that unless otherwise specified or restricted, the words "installation", "interconnection", and "connection" shall be understood in a general sense. For example, the connection may be a fixed connection, removable connection, integrated connection, mechanical connection, electrical connection, direct connection, indirect connection through intermediate media, or connection between two components. Persons of ordinary skill in the art can understand the specific meanings of the terms above in the disclosure as the case may be.

Moreover, the technical characteristics involved in different embodiments of the disclosure as described below can be combined together provided there is no discrepancy among them.

Figure 1:
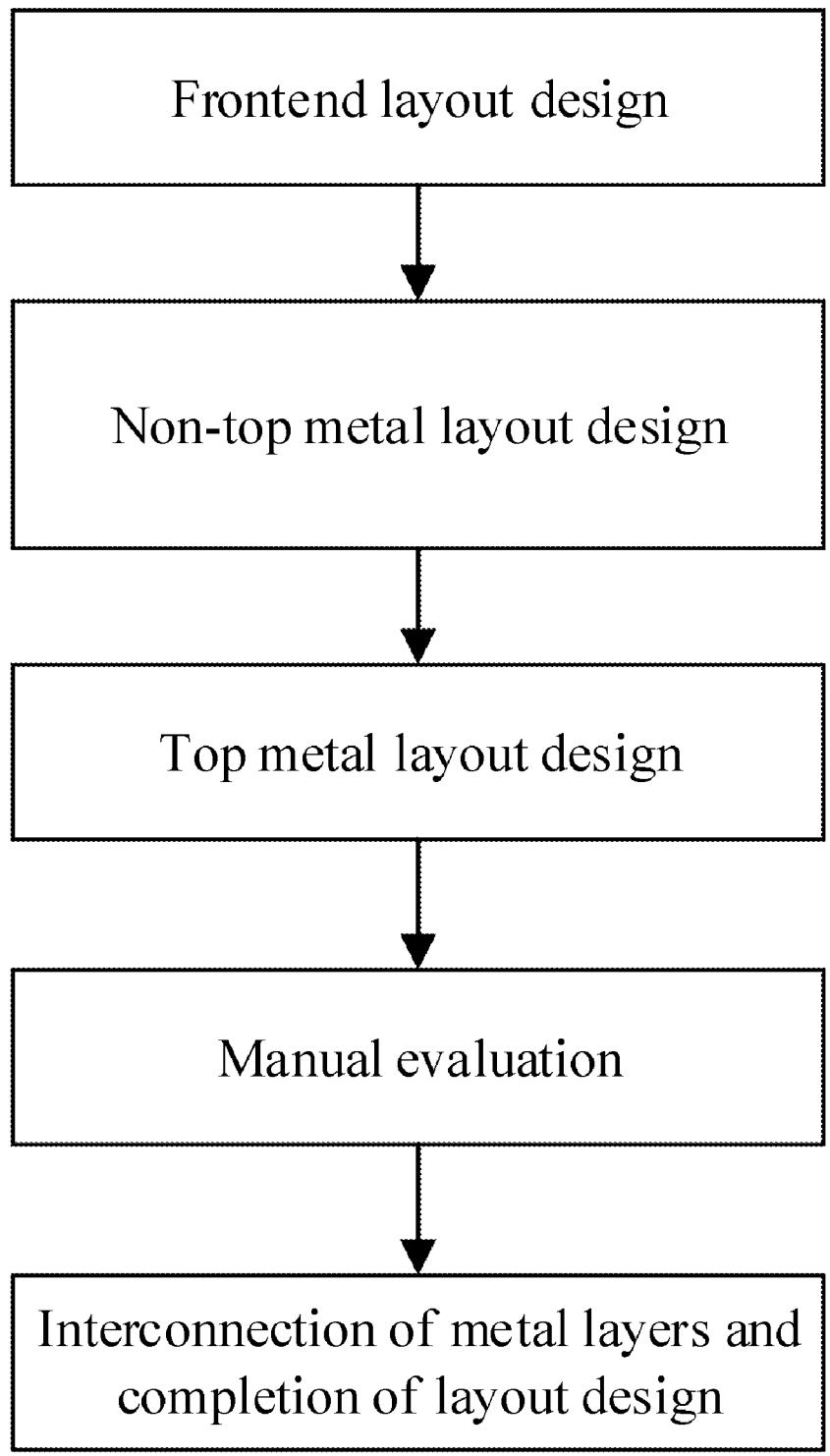
FIG. 1 is a flow chart of a method in an example of the disclosure.

The preferable example of the disclosure is shown in FIG. 1, which is a layout design method of power device, and specifically comprises the following steps:

S1: frontend layout design, which specifically comprises the following sub-steps:

S11: input the area parameter of the chip in this project or the area parameter allowed by the power chip layout drawing, specifically including that all available areas of all design layers are 3.3 mm*1.4 mm, which means that the area of all layers that can be used for layout design must be within this area, and all layer designs are planned under this area requirement;

S12: input specific process parameter values; specifically, input the key parameters for generating the frontend design, including information on the specific process category (obtained by identifying the device schematic diagram), the spacing between the boundary of the die diffusion region and the boundary of the innermost guard ring diffusion region (including direction X and direction Y) and the specific parameter values such as die pitch; wherein the specific values of design parameters vary under different processes, but the categories of basic parameters are almost consistent.

Figure 2:
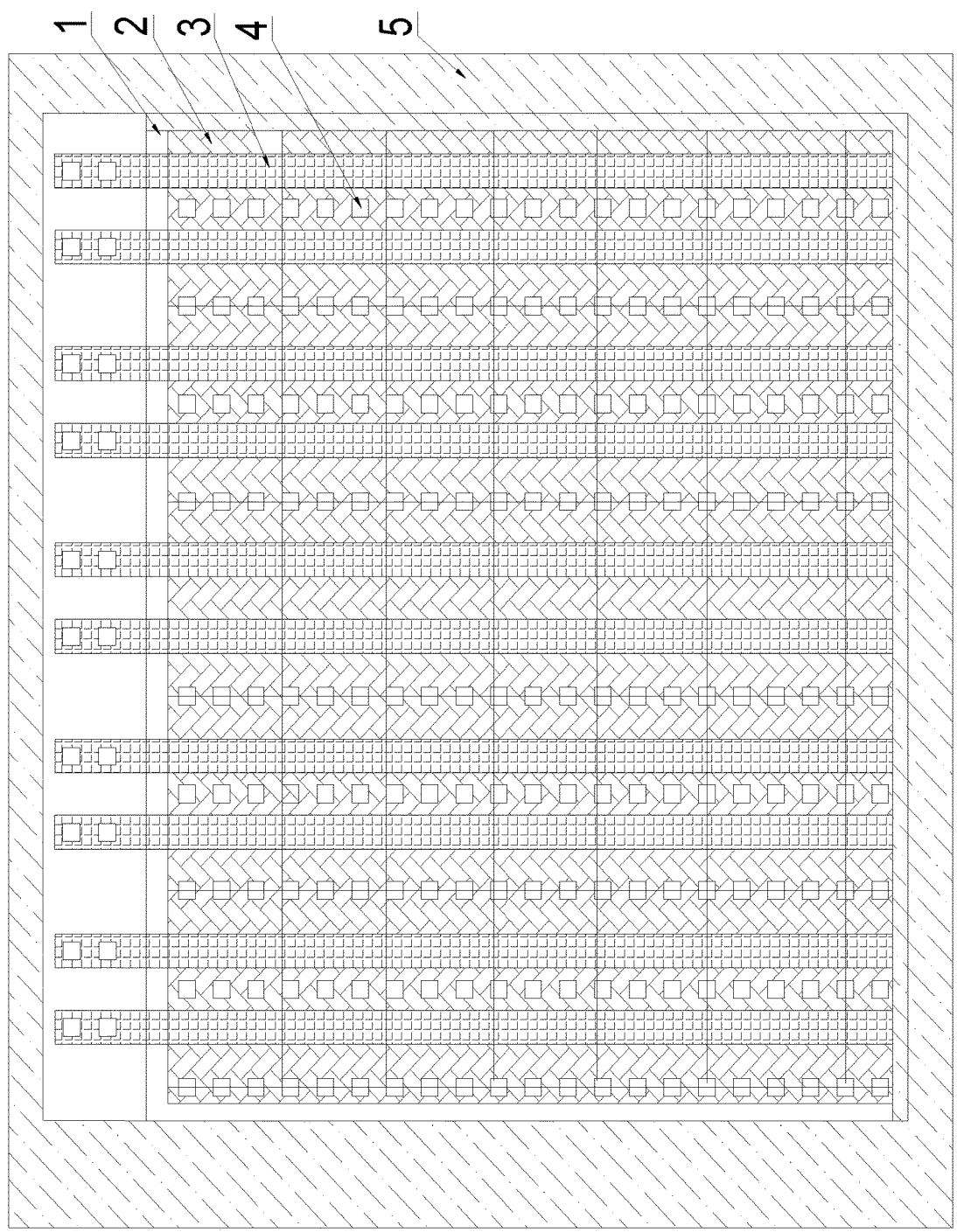
FIG. 2 is a schematic diagram of the frontend layout design in an example of the disclosure.

S13: output the frontend layout design; specifically, calculate the actual cell width and the integer value of the number of cells that can be placed according to the specific process parameter values in step S12, and output the layout design drawing of the frontend physical layer under a holistic vision. As shown in FIG. 2, the frontend layout design includes layout layers: 1—injection region; 2—active region; 3—gate region; 4—through-hole region; 5—well region. As the power device product requires layout design under a specific area, therefore the optimal design output of layout placement performed according to various parameter limits generally has a unique solution. Preferably, smaller parasitic parameter representations can be obtained by dividing the frontend layout twice or more.

Figure 3:
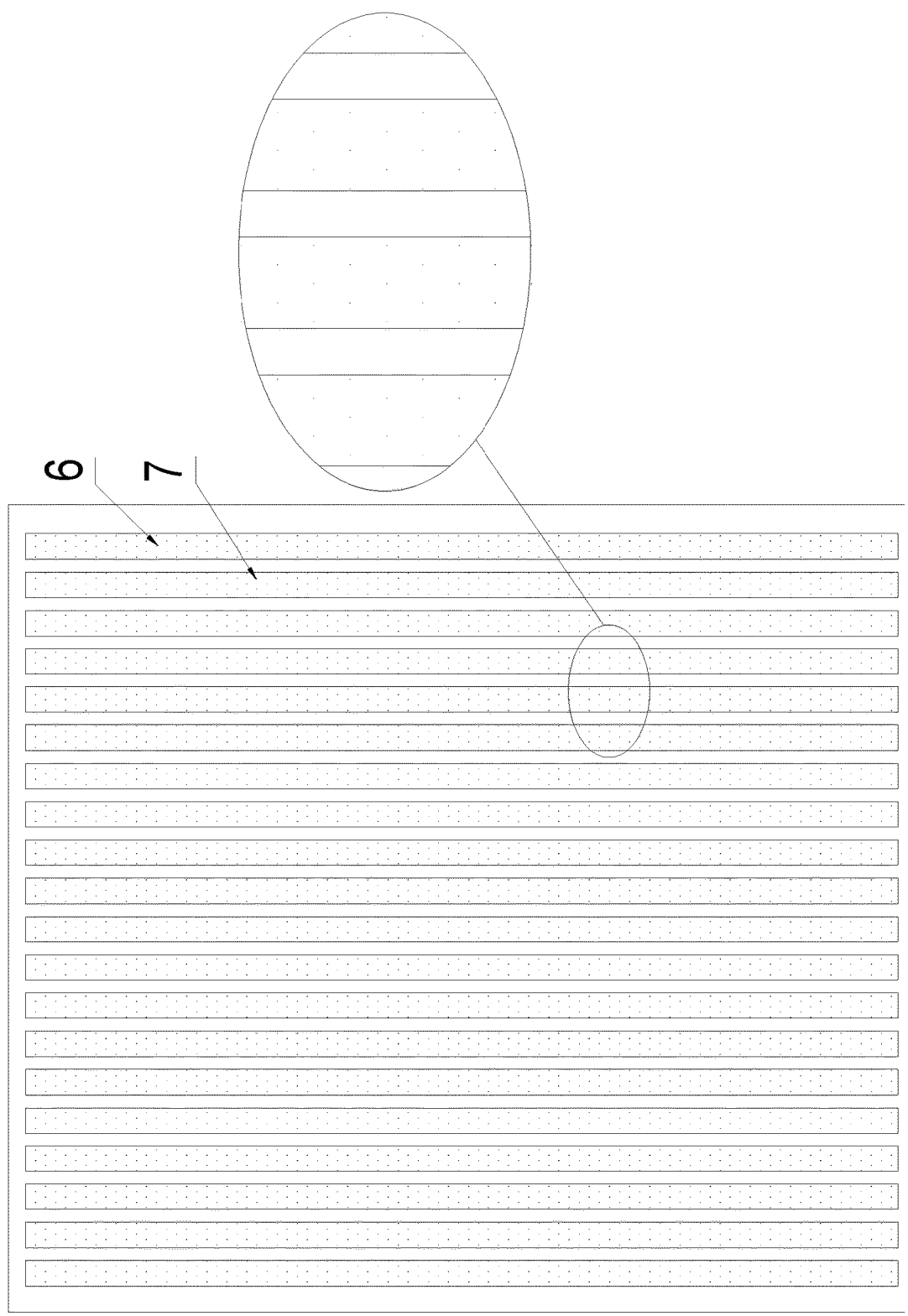
FIG. 3 is a schematic diagram of the underlying metal layout design in an example of the disclosure.
Figure 4:
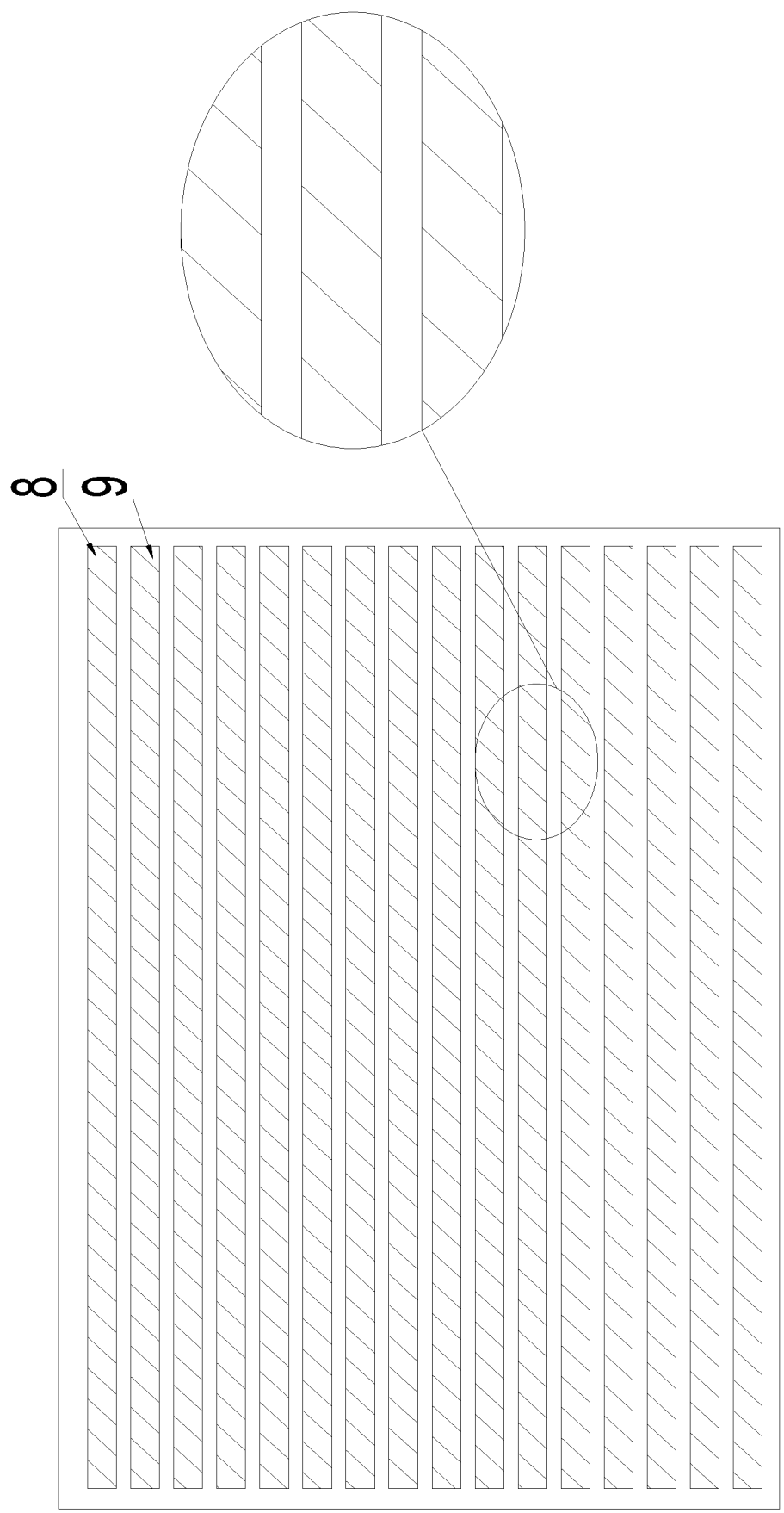
FIG. 4 is a schematic diagram of the sub-top metal layout design in an example of the disclosure.

S2: non-top metal layout design; wherein after the frontend layout design of the output layout is received, the distribution design of the top metal, underlying metal and sub-top metal in the full area range is continued. Specifically, the number of metal wires designed for each layer of wide metal is calculated according to the width of each layer of single metal received and in combination with the chip area parameter, which facilitates the evaluation of whether the overcurrent capacity is sufficient by the layout design engineer. It should be noted that this layout design planning can be applied to the overall metal planning in the whole layout design area, or to the application scenario of adopting ⅛ or ¼ unit design for realizing absolute symmetry. The layer of the non-top metal in this example is 2, including the underlying metal and the sub-top metal. The layout design of the underlying metal is shown in FIG. 3, and the planned direction of the underlying metal is consistent with that of the die direction, including the first source end 6 and the first drain end 7 which are sequentially distributed at intervals; the layout design of the sub-top metal is as shown in FIG. 4, including the second source end 8 and the second drain end 9 which are sequentially distributed at intervals; the sub-top metal is perpendicular to the underlying metal, parallel stack-up wiring is not adopted, the source end metal and drain end metal are designed to be equal in thickness, and the spacing is reserved to be minimum. Preferably, the diffusion regions of the source end and the drain end of each non-top metal are uniformly divided, occupying all available areas of the die unit, and the planning and design are performed from the upper metal layer to the lower metal layer in turn and perpendicularly, without stack-up wiring.

Figure 5:
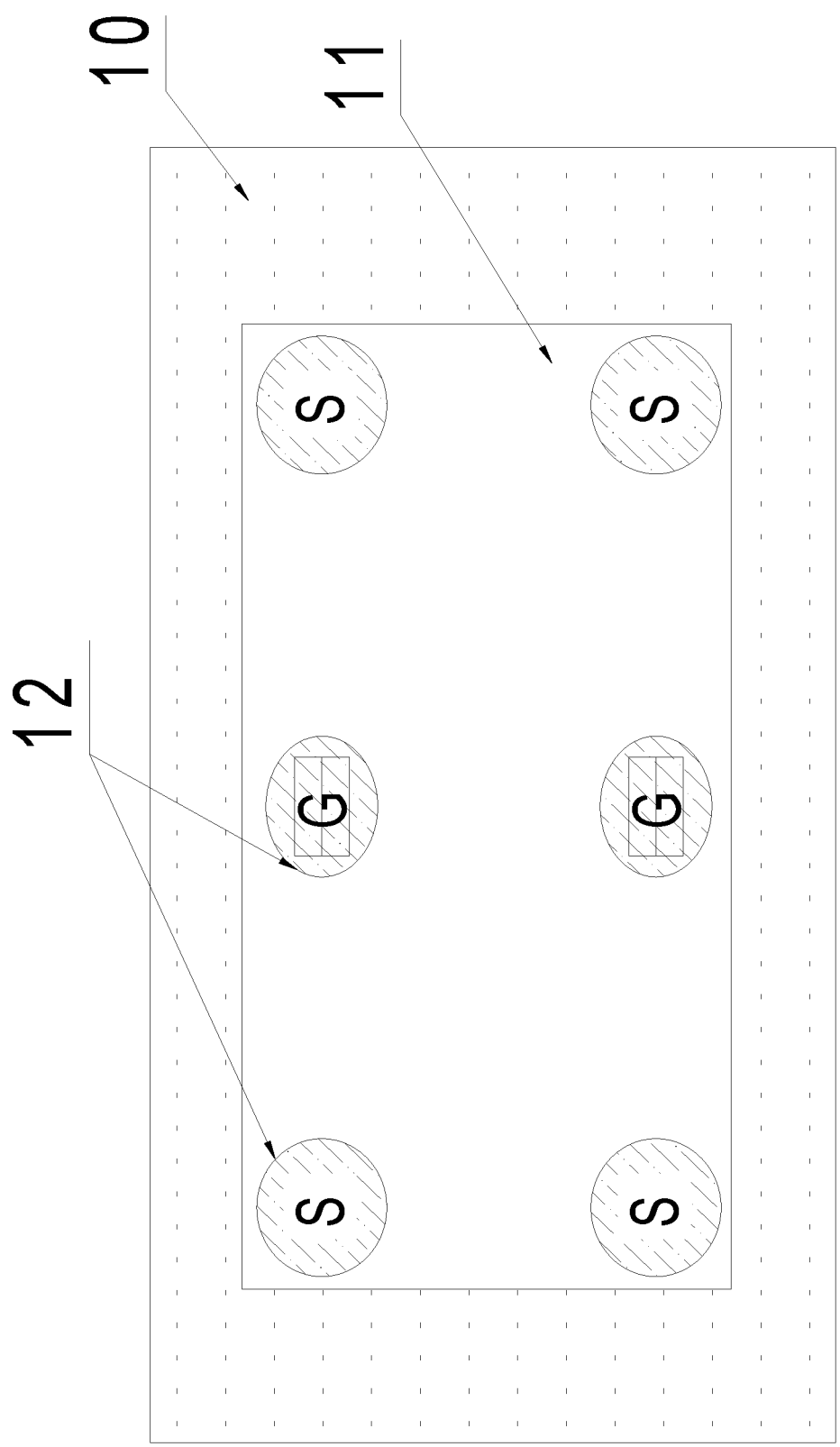
FIG. 5 is a schematic diagram of the top metal layout design in an example of the disclosure.

S3: top metal layout design, wherein based on the concept of design into sheets, as shown in FIG. 5, and the top metal is divided into the source end region 10 and drain end region 11, wherein the source end region comprises several source electrodes and gate electrodes of the device, and S-band represents the source electrodes and G represents the gate electrodes in FIG. 5; this step further comprises the planning and design of pad 12, including the pad dimension, pad size and position arrangement, and the wiring design of the metal wiring used for other ports of the device (including the source electrode of the device) beyond the pad area is carried out according to the rule that the source electrode and the drain electrode are sequentially arranged.

S4: evaluation steps of layout design, specifically, the layout design engineer evaluates the overall metal planning and design of power devices, and the main dimensions comprise: conformity evaluation of the wire width, quantity and overcurrent capability of the single metal wire corresponding to the source end and drain end of each layer of metal, rationality evaluation of the planned starting-ending allocation of metal of the source end and drain end, and dimension evaluation of design rationality such as rationality evaluation of top metal planning and allocation. Where the evaluation result shows irrationality, the metal wiring scheme needs to be adjusted, including the overall evaluation of metal wire width and metal arrangement; where the evaluation result is unacceptable, return to S2 and continue to input the metal wire width to adjust or increase the constraint conditions for further converge to obtain a result close to the expected result; alternatively, the metal wire width is directly adjusted according to the last wire width planning of each layer of metal wires to reduce or increase the last metal wire width and then adjust the overall metal wiring distribution, thereby optimizing the layout design until the adjustment meets the evaluation requirements.

S5: Interconnection of metal layers and completion of layout design. Specifically, the interconnection of metal layers means that the trenching design of wide metal is completed, and the contact holes are fully filled between metal layers to complete the full connection between metal layers. Preferably, the filling design is performed on the through-holes between the metals of each layer in step S5 to avoid the situation where the contact holes generated in the design process are repeatedly adjusted and the drawback of reduction of the layout design efficiency and accuracy. After the layout design is completed, the corresponding physical verification and modification are carried out until all designs pass the verification, that is, the layout design of this version of power products is completed.

The disclosure further comprises a chip, which is prepared and obtained using the layout design method of power device in the above preferable examples.

The disclosure further comprises a storage medium with the same inventive concept as the layout design method of power device in the preferable example above, on which computer instructions are stored, and the steps of the layout design method of power device above are performed when the computer instructions are executed.

Based on such an understanding, the technical solution of this embodiment or the part that contributes to the prior art or the part of the technical solution can be embodied in the form of a software product, which is stored in a storage medium and includes several instructions causing a computer device (which can be a personal computer, a server, or a network device) to execute all or part of the steps of the method described in each embodiment of the disclosure. The storage medium includes: USB flash drive, mobile hard disk, read-only memory (ROM), random access memory (RAM), diskette or CD, and other media available for storage of program codes.

The disclosure further comprises a terminal including a memory and a processor with the same inventive concept as the layout design method of power device in the above preferable examples, wherein computer instructions that can be operated in the processor are stored in the memory, and the steps of the layout design method of power device above are performed when the computer instructions are executed by the processor. The processor may be a single-core or multi-core central processing unit or a specific integrated circuit, or one or more integrated circuits configured to implement the disclosure.

Each functional unit in the embodiments provided by the disclosure may be integrated into one processing unit, or each unit may exist independently and physically, or two or more units may be integrated into one unit.

The above specific embodiments are detailed descriptions of the disclosure, and it could not be considered that the specific embodiments of the disclosure are only limited to these descriptions. Persons of ordinary skill in the art of the disclosure could also make some simple deductions and substitutions without departing from the concept of the disclosure, which should be deemed to fall within the protection scope of the disclosure.

What is claimed is:

1. A layout design method of power device, comprising the following steps:
   non-top metal layout design: a first metal is routed along a first direction and several first metal wires that fully occupy an available area of a die unit are thereby obtained, and wiring properties of the first metal wires are sequentially changed at intervals, making first source ends and first drain ends of the device are alternately distributed at intervals to complete the layout design of a first layer of metal; a second metal is routed along a vertical direction of the first direction and several second metal wires that fully occupy the available area of the die unit are thereby obtained, and the wiring properties of the second metal wires are sequentially changed at intervals, making second source ends and second drain ends of the device are alternately distributed at intervals to complete the layout design of a second layer of metal;
   top metal layout design: a source end region and a drain end region in a top metal are formed into sheets independently, and a pad is arranged in the source end region in the top metal;
   metal layer interconnection design: overlapping regions of the first and the second metal wires with same wiring properties are connected through a first contact hole, and the first or the second metal wire with the same wiring properties as the top metal is connected through a second contact hole.

2. The layout design method of power device of claim 1, wherein the first metal is routed along the first direction at a first wire width and a first interval and the several first metal wires evenly distributed are thereby obtained; and/or, the second metal is routed along the second direction at a second wire width and a second interval and the several second metal wires evenly distributed are thereby obtained.

3. The layout design method of power device of claim 2, wherein a wire width of a last metal wire before occupying the available area of the die unit is adjusted according to a remaining available area of the die unit.

4. The layout design method of power device of claim 2, wherein the first wire width and the second wire width are adjusted according to a current flowing through a present metal wire.

5. The layout design method of power device of claim 1, wherein the method further comprises the evaluation steps of:

evaluation of an overcurrent capability of a single metal wire in a non-top metal; and/or, evaluation of a quantity allocation of source ends and drain ends in the non-top metal; and/or, evaluation of a quantity allocation of source ends and drain ends in the top metal, and/or a pad placement region;

where an evaluation result is unqualified, the layout design should be modified; otherwise, a final layout design will be thereby obtained.

6. The layout design method of power device of claim 1, wherein the method further comprises a frontend layout design:

a frontend layout is generated according to chip area parameters, power device schematic diagram and process parameters.

7. The layout design method of power device of claim 6, wherein the generated frontend layout design specifically includes:

calculation of a number of cells that can be placed and a width between cells according to the chip area parameters, power device schematic diagram and process parameters, thereby generating the frontend layout.

8. The layout design method of power device of claim 6, wherein the frontend layout is divided several times and multiple die units are thereby obtained.

9. A chip, wherein the chip is prepared and obtained according to the layout design method of power device of claim 1.

10. A terminal including a memory and a processor, wherein computer instructions that can be operated in the processor are stored in the memory, and the steps of the layout design method of power device of claim 1 are performed when the computer instructions are executed by the processor.

* * * * *